United States Patent [19]
Marie

[11] Patent Number: 5,949,263
[45] Date of Patent: Sep. 7, 1999

[54] INTEGRATED CIRCUIT COMPRISING A PHASE-CONTROL LOOP WITH PROGRAMMABLE PHASE SHIFT

[75] Inventor: Hervé Marie, St. Aubin sur Mer, France

[73] Assignee: U.S. Philips Corporation, New York, N.Y.

[21] Appl. No.: 09/054,112

[22] Filed: Apr. 2, 1998

[30] Foreign Application Priority Data

Apr. 2, 1997 [FR] France ................................ 97 04000

[51] Int. Cl.⁶ ................................................ H03L 7/06
[52] U.S. Cl. .......................... 327/156; 327/159; 331/17; 331/DIG. 2
[58] Field of Search .................................. 327/156, 105, 327/106, 107, 116, 159, 141, 117; 375/376, 375; 331/17, DIG. 2

[56] References Cited

U.S. PATENT DOCUMENTS

| | | |
|---|---|---|
| 4,351,001 | 9/1982 | McGinn et al. ........................ 358/158 |
| 5,036,297 | 7/1991 | Nakamura ................................. 331/17 |
| 5,452,325 | 9/1995 | Brown ..................................... 375/376 |
| 5,565,928 | 10/1996 | Saeger .................................... 348/540 |
| 5,777,498 | 7/1998 | Cometti ................................... 327/156 |

Primary Examiner—Kenneth B. Wells
Assistant Examiner—Hai L. Nguyen
Attorney, Agent, or Firm—Brian J. Weighaus

[57] ABSTRACT

A known phase-control loop comprises an oscillator having a controllable frequency, a frequency divider and a phase comparator which compares a reference signal (CKREF) with the signal at the output of the frequency divider and controls the frequency of the oscillator.

The circuit also comprises, at the output of the oscillator, a phase shifter which supplies a signal (CKN0) at a multiple frequency of the input frequency and shifted in phase with respect to the signal of the oscillator, and a synchronizing module which may be simply constituted by a D flipflop with the input D connected to the output of the divider, and the input CLK connected to the output of the phase shifter, and which supplies a signal (CKREF0) at the frequency of the input signal (CKREF) but is locked at the output signal of the phase shifter.

7 Claims, 2 Drawing Sheets

INTEGRATED CIRCUIT COMPRISING A PHASE-CONTROL LOOP WITH PROGRAMMABLE PHASE SHIFT

BACKGROUND OF THE INVENTION

The invention relates to an integrated circuit including, inter alia, an assembly with a phase-control loop comprising an oscillator with an output for supplying a signal whose frequency is controllable by means of a voltage applied to a control input, a divider having an input connected to the output of the oscillator and an output for supplying a signal whose frequency is divided with respect to that of a signal applied to its input, and a phase comparator having two inputs, one of which is intended to receive a reference signal and the other is connected to the output of the divider, and an output connected to the control input of the oscillator.

The invention is applicable when two signals having a multiple frequency with respect to each other are required, whose transitions are perfectly in phase. It is, inter alia, applicable to an interface circuit for liquid crystal screens for generating the pixel frequency from the line clock signal.

A circuit which generates two signals whose transitions are in phase is known from U.S. Pat. No. 5,036,297. In the circuit as described in this document, an oscillator is followed by a delay line with taps, one of which is chosen by a selection circuit as a function of a phase comparison between a reference and the output signal.

SUMMARY OF THE INVENTION

It is an object of the invention to obtain a circuit which supplies two signals, one of which has a frequency which is a multiple of that of the other and whose transitions are perfectly in phase, and whose phase shift with respect to a clock remains constant when the frequency of the signals varies. The phase shift should ideally have the following properties: it should be programmable between 0 and 360°, work as well on several decades of the frequency and have a reduced contribution to the phase noise. In the prior-art assemblies, in which a delay line is used, this involves a given time shift which must be modified when the frequency varies.

To this end, the assembly also comprises a phase shifter having an output and an input connected to the output of the oscillator and means for supplying at its output a signal which is shifted in phase with respect to the signal at its input, and a resynchronizing module having a clock input connected to the output of the phase shifter and a signal input connected to the output of the divider.

In a particular embodiment, the resynchronizing module is a D-type flipflop.

In another particular embodiment, the resynchronizing module comprises a first D-type flipflop and a second flipflop of the same type, the clock input of the second flipflop receives the same clock signal as that of the first flipflop after an inversion in an inverter, the signal input of the first flipflop constitutes the input of the module, the output of the second flipflop constitutes the output of the module, and the output of the first flipflop is connected to the data input of the second flipflop via a multiplexer which is controlled by a digital phase-control input in such a way that either the input signal or the signal from the first flipflop is selected so as to be applied to the input of the second flipflop.

Advantageously, the phase shift performed by the phase shifter is programmable, the magnitude of this phase shift being controlled by a control signal applied to a control input.

Preferably, the oscillator has a double output which supplies a signal having two components: a principal signal and an annex signal shifted by $\pi/2$ with respect to the principal signal, and the phase shifter having a programmable phase shift has a double input connected to the double output of the oscillator.

The programmable phase shifter advantageously comprises a first and a second multiplier each having two inputs and one output, and an adder having two inputs connected to the output of the first multiplier and to the output of the second multiplier, respectively, the first inputs of each of the two multipliers jointly constituting the double input of the phase shifter, each second input of each multiplier being intended to receive a digital control word, these two control words having such values that the sum of their squares is constant, each multiplier being provided with means for supplying a signal which is the result of the multiplication of the signal at its first input by the value of the control word applied to its second input.

In such a phase shifter, in which the format of the control words is N bits, each multiplier advantageously comprises a switching stage consisting of N−1 switches each controlled by means of one of N−1 bits, an adder for adding the signals controlled by each switch, an inversion module connected to the output of the adder and controlled by the residual bit, and N−1 amplifiers arranged at the input and each preceding a switch, the gain of each amplifier being proportional to weights, in the control word, of the bit controlling the corresponding switch.

These and other aspects of the invention are apparent from and will be elucidated with reference to the embodiments described hereinafter.

DESCRIPTION OF THE PREFERRED EMBODIMENTS

Figure 1:
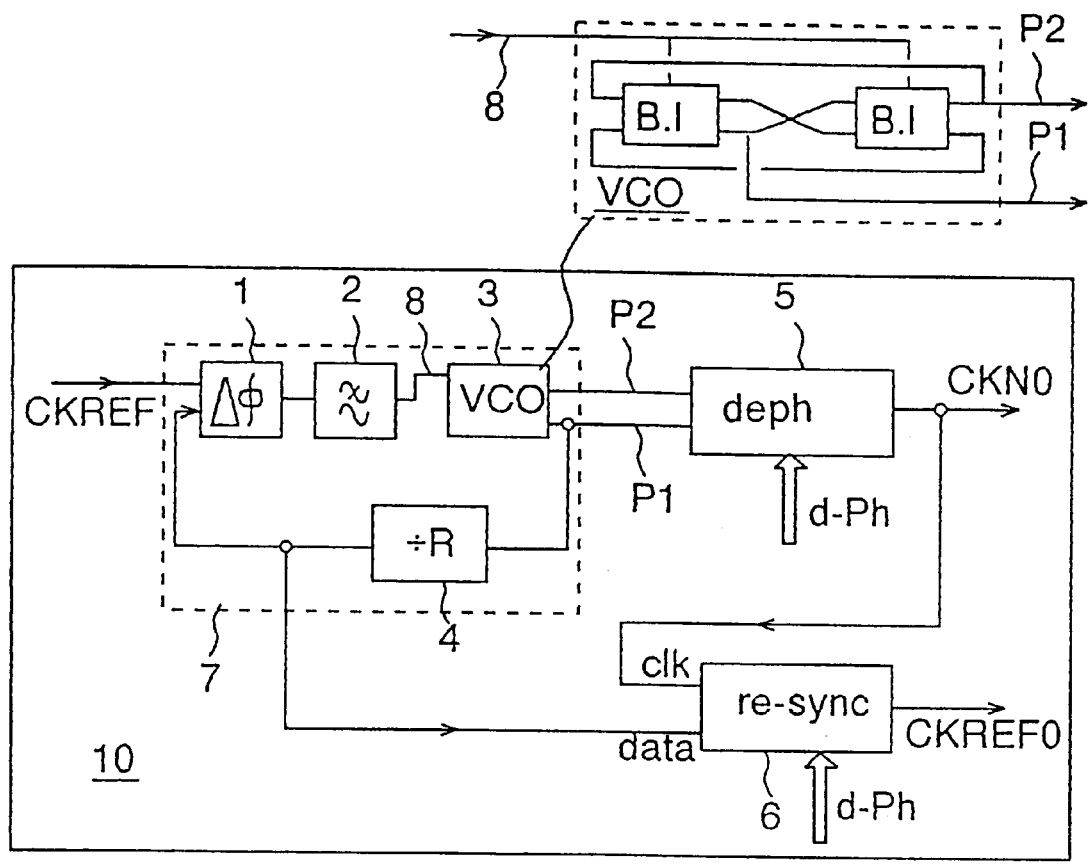
FIG. 1 shows an integrated circuit comprising an assembly with a phase-control loop.

The integrated circuit shown in FIG. 1 includes an assembly which comprises a phase-control loop 7. This loop comprises:

an oscillator 3 having a frequency which is adjustable by a voltage applied by means of a connection 8 and whose output delivers an oscillator signal having two components: a principal signal P1 and an annex signal P2 shifted by $\pi/2$ with respect to the principal signal P1. An oscillator which is capable of supplying such signals is known to those skilled in the art and, as is shown in the circuit diagram at the top of the Figure, may be constituted by means of two integrators indicated "B.I" supplying a symmetrical or balanced signal and connected in cascade with a lead-crossing between them, i.e. with an inversion of the symmetrical signal, and arranged in a loop. The frequency is controlled by the signal at the connection 8, applied to each of the two integrators. Two signals P1, P2 shifted by $\pi/2$ are present at the respective outputs of the first and second integrators;

a divider 4 which divides the signal P1 in frequency in a ratio R;

a phase comparator 1 which compares the phase of the signals applied to its two inputs, one of which is connected to a reference signal CKREF and the other is connected to the output of the frequency divider 4. The output voltage of the comparator is applied via a low-pass filter 2 to the connection 8 for controlling the frequency of the oscillator 3.

This assembly also comprises a phase-shifting circuit 5 whose phase shift is programmable by means of a digital control signal d-Ph. This phase shifter has a double input connected to the output signals P1 and P2 of the oscillator 3, and supplies at its output CKN0 a signal which is phase-shifted with respect to the input signal P1/P2, the magnitude of this phase shift being controlled by the control signal d-Ph. Such a circuit will hereinafter be described in greater detail.

A resynchronizing module 6 has a clock input "clk" connected to the output of the phase-shifting circuit 5, a "data" signal input connected to the output of the divider 4, and an input for the control signal d-Ph. Its output constitutes the output CKREF0 of the assembly. A conventional D flipflop is appropriate for this circuit 6, in this case the signal d-Ph is not used. Nevertheless, in this mode, a circuit which is more advantageous than a D flipflop will hereinafter be described in greater detail.

Figure 2:
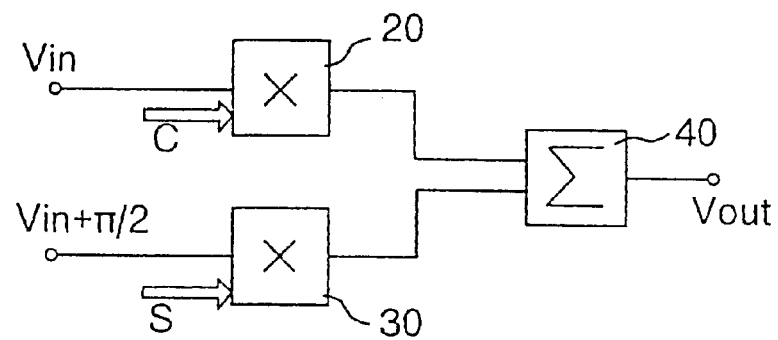
FIG. 2 shows an embodiment of a programmable phase shifter.

FIG. 2 shows a programmable phase shifter suitable for the phase shifter 5 of FIG. 1. Such a programmable phase shifter has a double input which is intended to receive an input signal to be phase-shifted by a variable quantity and constituted by two signals of the same frequency but shifted by 90° with respect to each other, for example of the form A. cos ωt and A. sin ωt, i.e. Vin and Vin+π/2. A second double input denoted as C and S receives a digital control signal and the output Vout supplies an output signal of the form A'. cos(ωt−Φ) which, with respect to the input signal, has a phase shift Φ defined by the control signal.

The input Vin is connected to an input of a first multiplier 20 and the input Vin+π/2 is connected to an input of a second multiplier 30. The output of the first multiplier 20 supplies a signal resulting from the multiplication of the signal Vin=A. cos ωt received at its input by a digital value C which is equal to V. cos(Φ) in which Φ is the desired phase shift and V is a constant value. The output of the second multiplier 30 supplies a signal resulting from the multiplication of the signal Vin+π/2=A. sin ωt by a value S which is equal to V. sin(Φ). Since the values of S and C are equal to V. sin(Φ) and V. cos(Φ), respectively, the sum of their squares is constant (because $\sin^2+\cos^2=1$). The phase shifter also comprises an adder 40 having a first input connected to the output of the first multiplier 20, a second input connected to the output of the second multiplier 30 and supplying a phaseshifted signal of the form A.V. cos(ωw−Φ) at its output Vout, resulting from the sum of the signals received at its first and second inputs.

Figure 3:
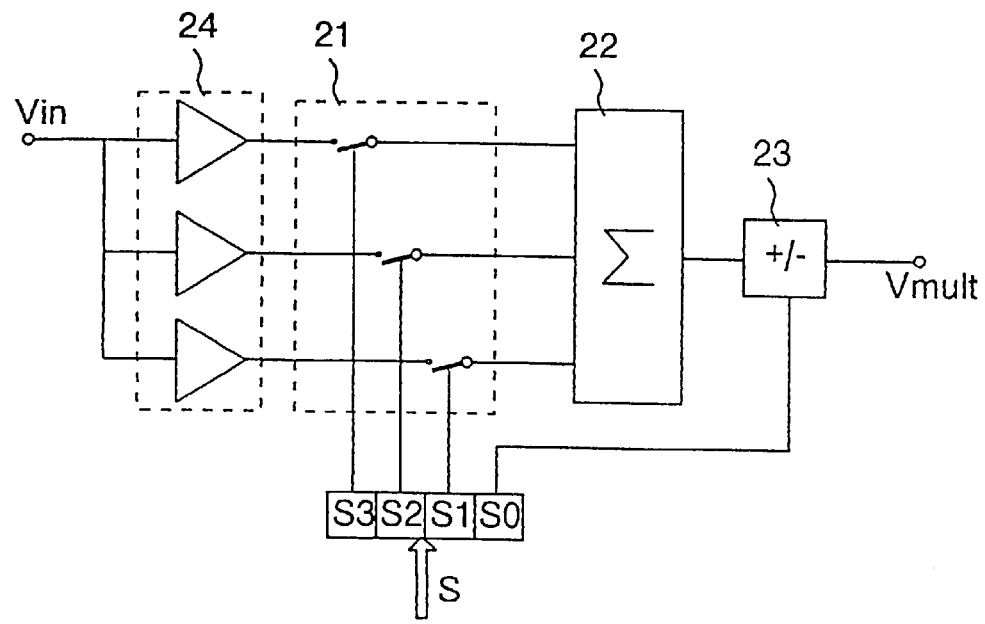
FIG. 3 shows an embodiment of a multiplier in the programmable phase shifter of FIG. 2.

FIG. 3 shows diagrammatically the multiplier 20 of FIG. 2 (the multiplier 30 is identical). Here, the control word C has, by way of example, 4 bits S0, S1, S2, S3.

This multiplier comprises:

a switching stage 21 consisting of three switches controlled by the three bits S1, S2, S3, an adder 22 having one output and 3 inputs each connected to one of the switches, an inversion module 23 which inverts or does not invert the signal in accordance with the value of the bit S0, which module has its input connected to the output of the adder 22 and the output constitutes the output Vmult of the multiplier 20, an amplifier stage 24 consisting of 3 amplifiers, arranged at the input of the assembly, each amplifier receiving the input signal Vin of the multiplier, the output signals being each controlled by one of the 3 switches of the switching stage 21. The gain of the $i^{th}$ amplifier (i=1 to 3) is proportional to the weights, in the control word, of the bit controlling the subsequent switch.

Figure 4:
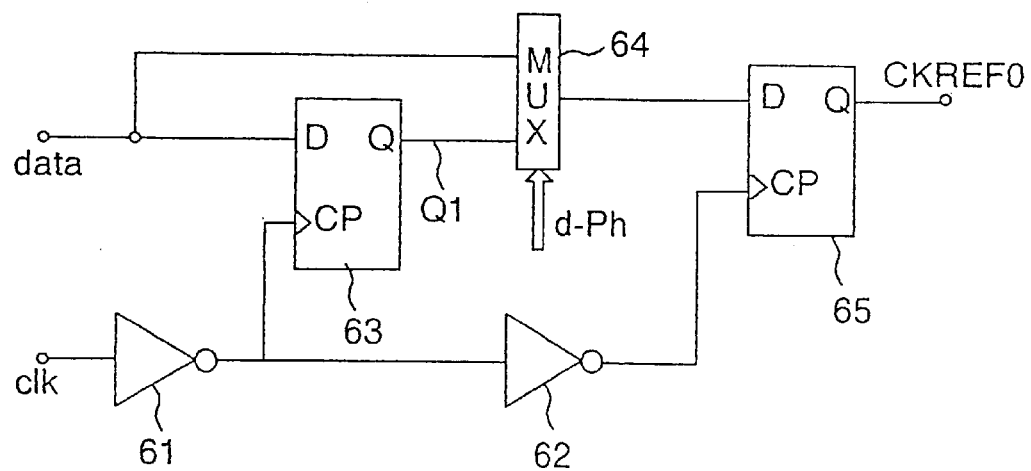
FIG. 4 shows an embodiment of a resynchronizing module.

The circuit of FIG. 4 is preferable to a simple flipflop D for realizing the resynchronizing module 6 of FIG. 1. With such a flipflop, the change of state cannot be anticipated and an edge may be missing if the edge of "clk" is quasi-coincident with an edge of "data". The assembly of FIG. 4 has the same inputs and output as a D flipflop, namely a resynchronizing data input "data" which corresponds to the "data" input of FIG. 1, a clock input "clk" which corresponds to the "clk" input of FIG. 1 and an output CKREF0 which corresponds to the output CKREF0 of FIG. 1. It comprises a first flipflop 63 of the D type and a second flipflop 65 of the same type. The clock input of the flipflop 63 receives the "clk" clock after inversion in an inverter 61. The clock input of the flipflop 65 receives the same clock after a second inversion in an inverter 62. The signal input of the flipflop 63 is connected to the "data" input. The output of the flipflop 65 is connected to the output CKREF0 and its input is connected to the output of a multiplexer 64. The latter is controlled by the digital control input of the phase d-Ph such that it either selects the "data" input signal or the signal Q1 from the flipflop 63. The "data" signal is first synchronized in the flipflop 63 at a falling edge of the clock, which yields the signal Q1, and then Q1 is resynchronized in the flipflop 65 on a rising edge. When "data" and "clk" are not coincident, which corresponds to particular values of the signal d-Ph, the multiplexer 64 chooses the "data" signal which is then resynchronized by the flipflop 65.

I claim:

1. An integrated circuit, comprising a phase-control loop comprising:

an oscillator with a control input, and an output for supplying a signal whose frequency is controllable by a voltage applied to the control input, a divider having an input connected to the output of the oscillator and an output for supplying a signal whose frequency is divided with respect to that of a signal applied to the divider input, a phase comparator having two inputs, one input to receive a reference signal and the other input connected to the output of the divider, and an output connected to the control input of the oscillator, a phase shifter having an output, an input connected to the output of the oscillator, which phase shifter supplies at the phase shifter output a signal which is shifted in phase with respect to the signal at the phase shifter input, and a resynchronizing module having a clock input connected to the output of the phase shifter and a signal input connected to the output of the divider, the resynchronizing module synchronizing the output signal of the phase shifter to the output signal of the divider.

2. An integrated circuit as claimed in claim 1, characterized in that the resynchronizing module is a D-type flipflop.

3. An integrated circuit as claimed in claim 1, characterized in that the resynchronizing module comprises a first D-type flipflop and a second D-type flipflop, the clock input of the second flipflop receives the same clock signal as that of the first flipflop after an inversion in an inverter, the first flipflop having a signal input which constitutes the input of the module, the second flipflop having an output which constitutes the output of the resynchronizing module, the first flipflop having an output connected to a data input of the second flipflop via a multiplexer which is controlled by a digital phase-control input in such a way that either the input signal or the signal from the first flipflop is selected so as to be applied to the input of the second flipflop.

4. An integrated circuit as claimed in claim 1, characterized in that the phase shift performed by the phase shifter is programmable, a magnitude of this phase shift being controlled by a control signal applied to a control input.

5. An integrated circuit as claimed in claim 4, characterized in that the oscillator has a double output which supplies a signal having two components: a principal signal and an annex signal shifted by $\pi/2$ with respect to the principal signal, and the phase shifter having a programmable phase shift has a double input connected to the double output of the oscillator.

6. An integrated circuit as claimed in claim 5, characterized in that the programmable phase shifter comprises a first and a second multiplier each having two inputs and one output, and an adder having two inputs connected to the output of the first multiplier and to the output of the second multiplier, respectively, the first inputs of each of the two multipliers jointly constituting the double input of the phase shifter, each second input of each multiplier being intended to receive a digital control word, these two control words having such values that the sum of their squares is constant, each multiplier being provided with means for supplying a signal which is the result of the multiplication of the signal at its first input by the value of the control word applied to its second input.

7. An integrated circuit as claimed in claim 6, characterized in that, with the format of the control words being N bits, the N bits including N−1 most significant bits and a residual bit, each multiplier comprises a switching stage consisting of N−1 switches each controlled by one of N−1 bits, an adder for adding the signals controlled by each switch, an inversion module connected to the output of the adder and controlled by the residual bit, and N−1 amplifiers each amplifying a voltage from said oscillator and feeding a switch, the gain of each amplifier being proportional to weights, in the control word, of the bit controlling the corresponding switch.

\* \* \* \* \*